United States Patent
Karczewski et al.

(10) Patent No.: US 11,404,889 B2
(45) Date of Patent: Aug. 2, 2022

(54) POWER SAVING CIRCUIT FOR EMBEDDED BATTERY APPLICATIONS

(71) Applicant: GoPro, Inc., San Mateo, CA (US)

(72) Inventors: Casimir Karczewski, Mountain View, CA (US); Aaron O'Brien, Santa Clara, CA (US); Rajesh Madhur, San Jose, CA (US); Sameer Mysore Venugopal, Milpitas, CA (US)

(73) Assignee: GoPro, Inc., San Mateo, CA (US)

( * ) Notice: Subject to any disclaimer, the term of this patent is extended or adjusted under 35 U.S.C. 154(b) by 435 days.

(21) Appl. No.: 16/229,846

(22) Filed: Dec. 21, 2018

(65) Prior Publication Data
US 2020/0203967 A1    Jun. 25, 2020

(51) Int. Cl.
*H02J 7/00* (2006.01)
*H03K 17/687* (2006.01)
*H03K 19/0185* (2006.01)

(52) U.S. Cl.
CPC .......... *H02J 7/0031* (2013.01); *H03K 17/687* (2013.01); *H03K 19/018507* (2013.01)

(58) Field of Classification Search
CPC .. H02J 7/0031; H02J 7/00306; H03K 17/687; H03K 19/018507
USPC ......................................................... 320/136
See application file for complete search history.

(56) References Cited

U.S. PATENT DOCUMENTS

| | | | | |
|---|---|---|---|---|
| 5,790,961 A | * | 8/1998 | Ingram | G06F 1/26 455/343.1 |
| 9,070,059 B2 | * | 6/2015 | Caruana | G06K 19/0701 |
| 2004/0113496 A1 | * | 6/2004 | Nguyen | G01R 31/40 307/66 |
| 2005/0088147 A1 | * | 4/2005 | Svensson | H02J 7/0031 320/134 |
| 2011/0197389 A1 | * | 8/2011 | Ota | H01M 50/572 15/339 |
| 2016/0352106 A1 | * | 12/2016 | Schimel | H02J 7/0031 |
| 2018/0131208 A1 | * | 5/2018 | Park | G01R 31/3835 |

OTHER PUBLICATIONS

Mosaic Documentation Web, "Latch and Toggle Circuits for on/off Power Control", https://web.archive.org/web/20121009234431/http://www.mosaic-industries.com/embedded-systems/microcontroller-projects/electronic-circuits/push-button-switch-turn-on/latching-toggle-power-switch (Year: 2012).*

* cited by examiner

*Primary Examiner* — Jack Chiang
*Assistant Examiner* — Brandon Bowers
(74) *Attorney, Agent, or Firm* — Young Basile Hanlon & MacFarlane, P.C.

(57) ABSTRACT

A battery-disconnect circuit may include a latch, a battery-disconnect subcircuit, and a power-enable subcircuit. The battery-disconnect subcircuit may be configured to control current leakage. The battery-disconnect subcircuit may be connected to the latch. The latch may be configured to maintain a power supply state of the battery-disconnect subcircuit, a no-power supply state of the battery-disconnect subcircuit, or both. The power-enable subcircuit may be connected to the battery-disconnect subcircuit. The power-enable subcircuit may be configured to switch the battery-disconnect subcircuit to the power supply state based on an enable signal. The power-enable subcircuit may be configured to switch the battery-disconnect subcircuit to the no-power supply state based on an off signal.

20 Claims, 12 Drawing Sheets

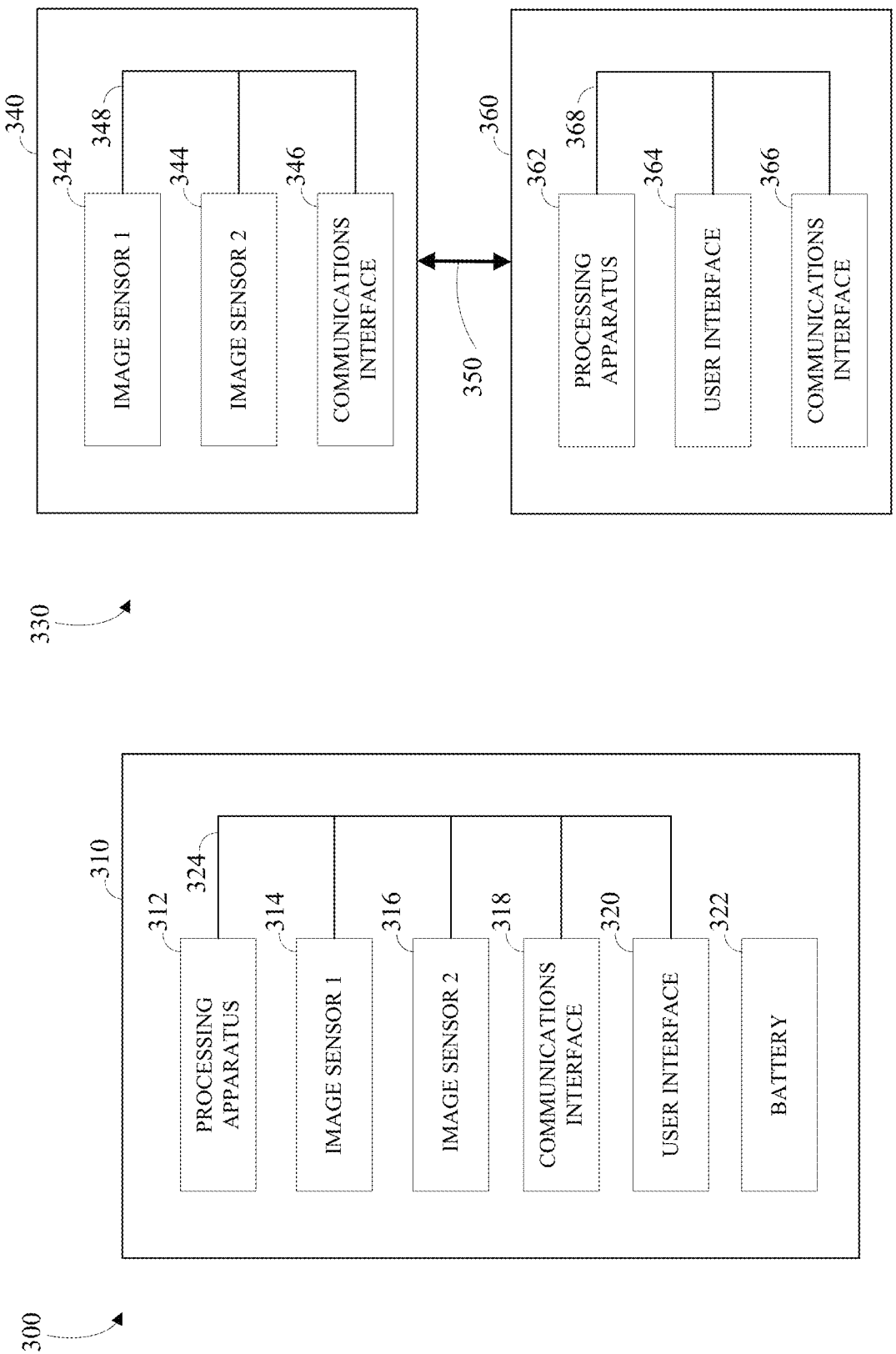

POWER SAVING CIRCUIT FOR EMBEDDED BATTERY APPLICATIONS

TECHNICAL FIELD

This disclosure relates to power savings in electronic devices.

BACKGROUND

Batteries that are embedded in electronic devices discharge over time, even when the electronic device is not in use. For example, a device may drain 25-200 µA of current when the device is in storage. In order for a device to remain rechargeable for two or more years, it would be desirable to have an electronic device that drains a minimal amount of current over a two or more year storage life.

SUMMARY

Disclosed herein are implementations of a power saving circuit. The power saving circuit may be used in embedded battery applications. The power saving circuit may be used in any device, for example a computing device, an image capture device, an audio device, or the like. The device may be a portable device or a non-portable device.

A battery-disconnect circuit may include a latch, a battery-disconnect subcircuit, and a power-enable subcircuit. The battery-disconnect subcircuit may be configured to control current leakage. The battery-disconnect subcircuit may be connected to the latch. The latch may be configured to maintain a power supply state of the battery-disconnect subcircuit, a no-power supply state of the battery-disconnect subcircuit, or both. The power-enable subcircuit may be connected to the battery-disconnect subcircuit. The power-enable subcircuit may be configured to switch the battery-disconnect subcircuit to the power supply state based on an enable signal. The power-enable subcircuit may be configured to switch the battery-disconnect subcircuit to the no-power supply state based on an off signal.

An image capture device may include a battery, a processor, and a battery-disconnect circuit. The battery-disconnect circuit may be connected to the battery and the processor. The battery-disconnect circuit may include a latch, a battery-disconnect subcircuit, and a power-enable subcircuit. The battery-disconnect subcircuit may be configured to control current leakage, for example, from the battery. The battery-disconnect subcircuit may be connected to the latch. The latch may be configured to maintain a power supply state of the battery-disconnect subcircuit, a no-power supply state of the battery-disconnect subcircuit, or both. The power-enable subcircuit may be connected to the battery-disconnect subcircuit. The battery-disconnect subcircuit may be configured to switch to the power supply state in response to an enable signal. The battery-disconnect subcircuit may be configured to switch to the no-power supply state in response to an off signal.

In an aspect, a battery-disconnect circuit may include a latch, a battery-disconnect subcircuit, a power-enable subcircuit, and an on-off subcircuit. The battery-disconnect subcircuit may be connected to the latch. The latch may be configured to maintain a power supply state of the battery-disconnect subcircuit, a no-power supply state of the battery-disconnect subcircuit, or both. The power-enable subcircuit may be connected to the battery-disconnect subcircuit. The battery-disconnect subcircuit may switch to the power supply state in response to an enable signal. The on-off subcircuit may be connected to the battery-disconnect subcircuit. The battery-disconnect subcircuit may switch to the power supply state in response to an on signal. The battery-disconnect subcircuit may switch to the no-power supply state in response to an off signal. The on-off subcircuit may be configured to control current leakage, for example, from the battery.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIGS. 3A-B are block diagrams of examples of image capture systems.

DETAILED DESCRIPTION

Figure 1A:
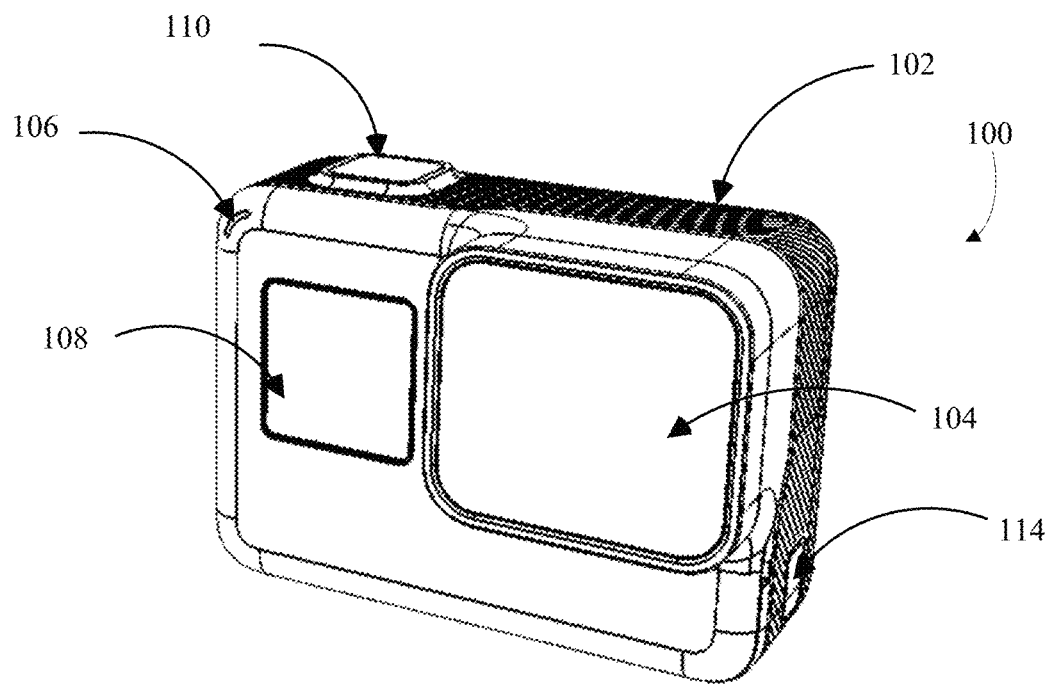
FIGS. 1A-D are isometric views of an example of an image capture device.
Figure 1B:
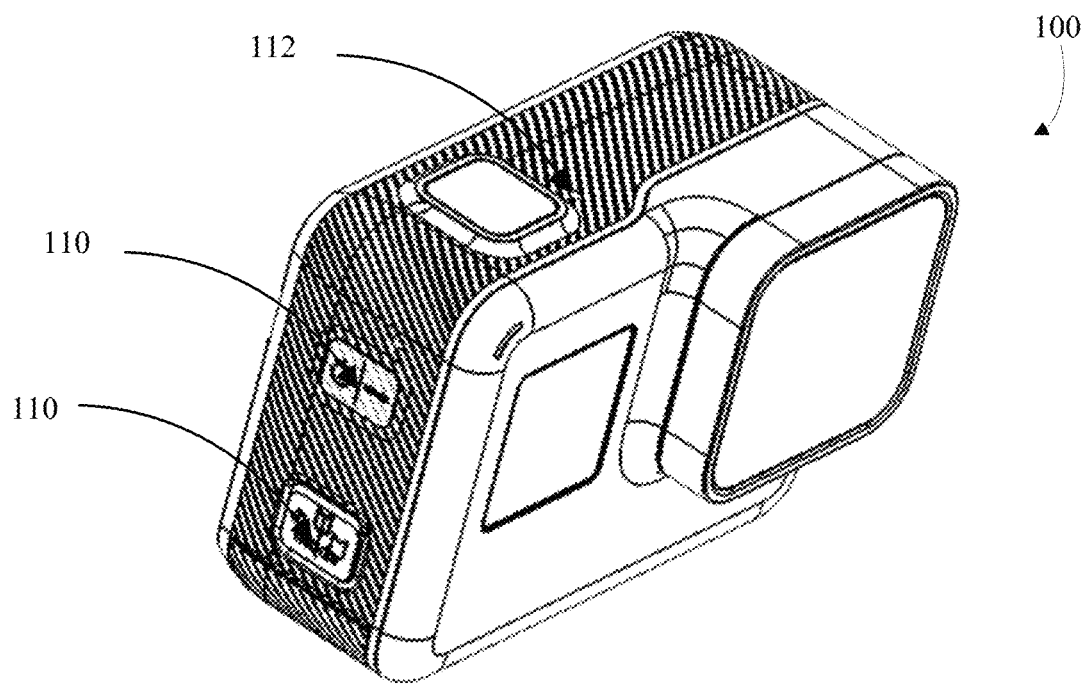
Figure 1C:
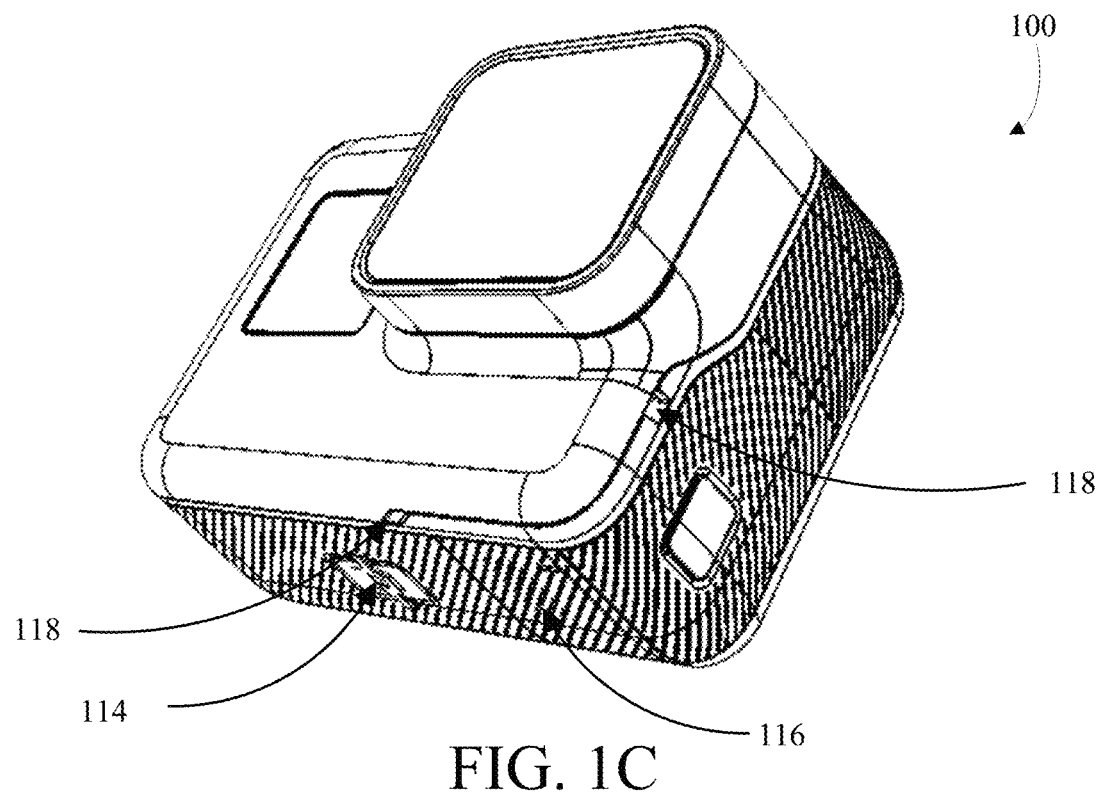
Figure 1D:
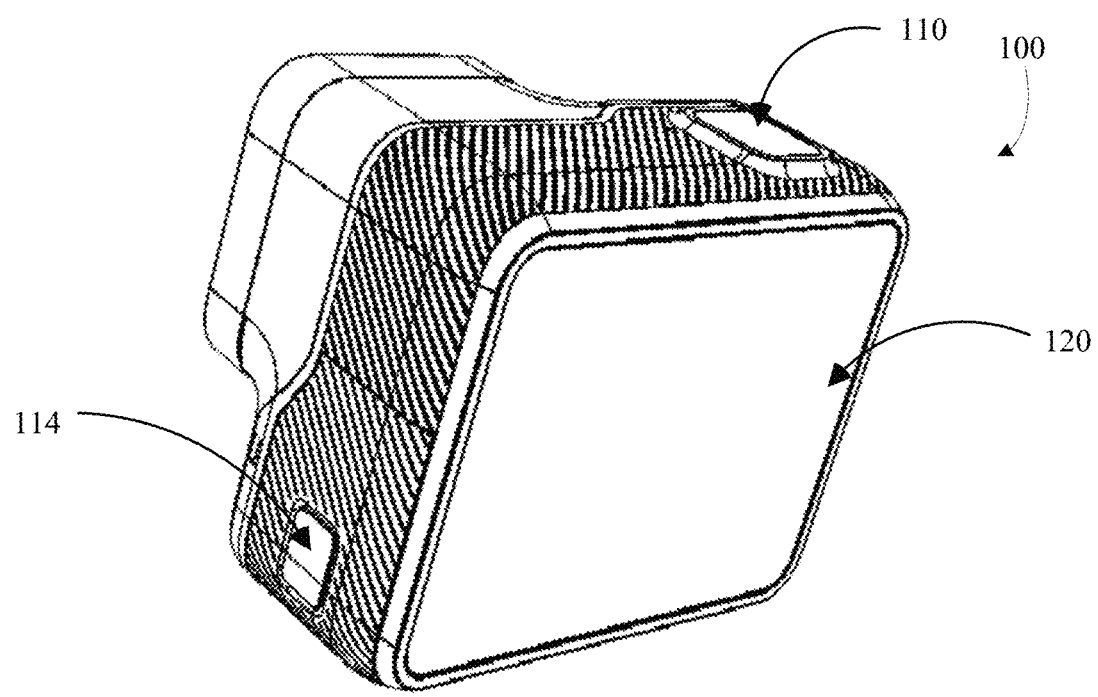

FIGS. 1A-D are isometric views of an example of an image capture device 100. The image capture device 100 may include a body 102 having a lens 104 structured on a front surface of the body 102, various indicators on the front of the surface of the body 102 (such as LEDs, displays, and the like), various input mechanisms (such as buttons, switches, and touch-screen mechanisms), and electronics (e.g., imaging electronics, power electronics, etc.) internal to the body 102 for capturing images via the lens 104 and/or performing other functions. The image capture device 100 may be configured to capture images and video and to store captured images and video for subsequent display or playback.

The image capture device 100 may include various indicators, including LED lights 106 and LCD display 108. The image capture device 100 may also include buttons 110 configured to allow a user of the image capture device 100 to interact with the image capture device 100, to turn the image capture device 100 on, and to otherwise configure the operating mode of the image capture device 100. The image capture device 100 may also include a microphone 112 configured to receive and record audio signals in conjunction with recording video. A side of the image capture device 100 may include an I/O interface 114. The image capture device 100 may also include another microphone 116 integrated into the body 102 or housing. The front surface of the image capture device 100 may include two drainage ports as part of a drainage channel 118. The image capture device 100 may include an interactive display 120 that allows for interaction with the image capture device 100 while simultaneously displaying information on a surface of the image capture device 100. As illustrated, the image capture device 100 may include the lens 104 that is configured to receive light incident upon the lens 104 and to direct received light onto an image sensor internal to the lens 104.

The image capture device 100 of FIGS. 1A-D includes an exterior that encompasses and protects the internal electronics which are further described in later sections. In the present example, the exterior includes six surfaces (i.e. a front face, a left face, a right face, a back face, a top face, and a bottom face) that form a rectangular cuboid. Furthermore, both the front and rear surfaces of the image capture device 100 are rectangular. In other embodiments, the exterior may have a different shape. The image capture device 100 may be made of a rigid material such as plastic, aluminum, steel, or fiberglass. Additional features, such as the features described above, may be affixed to the exterior. In some embodiments, the image capture device 100 described herein includes features other than those described below. For example, instead of a single interface button, the image capture device 100 may include additional buttons or different interface features, such as multiple microphone openings to receive voice or other audio commands.

Although not expressly shown in FIGS. 1A-D, in some implementations, the image capture device 100 may include one or more image sensors, such as a charge-coupled device (CCD) sensor, an active pixel sensor (APS), a complementary metal-oxide semiconductor (CMOS) sensor, an N-type metal-oxide-semiconductor (NMOS) sensor, and/or any other image sensor or combination of image sensors.

Although not expressly shown in FIGS. 1A-D, the image capture device 100 may include one or more other information sources or sensors, such as an inertial measurement unit (IMU), a global positioning system (GPS) receiver component, a pressure sensor, a temperature sensor, a biometric sensor, or any other unit, or combination of units, that may be included in an image capture apparatus.

The image capture device 100 may interface with or communicate with an external device, such as an external user interface device, via a wired or wireless computing communication link (not shown). The user interface device may, for example, be the personal computing device 360 described below with respect to FIG. 3B. Any number of computing communication links may be used. The computing communication link may be a direct computing communication link or an indirect computing communication link, such as a link including another device or a network, such as the internet, may be used. In some implementations, the computing communication link may be a Wi-Fi link, an infrared link, a Bluetooth (BT) link, a cellular link, a ZigBee link, a near field communications (NFC) link, such as an ISO/IEC 20643 protocol link, an Advanced Network Technology interoperability (ANT+) link, and/or any other wireless communications link or combination of links. In some implementations, the computing communication link may be an HDMI link, a USB link, a digital video interface link, a display port interface link, such as a Video Electronics Standards Association (VESA) digital display interface link, an Ethernet link, a Thunderbolt link, and/or other wired computing communication link.

The image capture device 100 may transmit images, such as panoramic images, or portions thereof, to the user interface device (not shown) via the computing communication link, and the user interface device may store, process, display, or a combination thereof the panoramic images.

The user interface device may be a computing device, such as a smartphone, a tablet computer, a phablet, a smart watch, a portable computer, and/or another device or combination of devices configured to receive user input, communicate information with the image capture device 100 via the computing communication link, or receive user input and communicate information with the image capture device 100 via the computing communication link.

The user interface device may display, or otherwise present, content, such as images or video, acquired by the image capture device 100. For example, a display of the user interface device may be a viewport into the three-dimensional space represented by the panoramic images or video captured or created by the image capture device 100.

The user interface device may communicate information, such as metadata, to the image capture device 100. For example, the user interface device may send orientation information of the user interface device with respect to a defined coordinate system to the image capture device 100, such that the image capture device 100 may determine an orientation of the user interface device relative to the image capture device 100. Based on the determined orientation, the image capture device 100 may identify a portion of the panoramic images or video captured by the image capture device 100 for the image capture device 100 to send to the user interface device for presentation as the viewport. In some implementations, based on the determined orientation, the image capture device 100 may determine the location of the user interface device and/or the dimensions for viewing of a portion of the panoramic images or video.

The user interface device may implement or execute one or more applications to manage or control the image capture device 100. For example, the user interface device may include an application for controlling camera configuration, video acquisition, video display, or any other configurable or controllable aspect of the image capture device 100.

The user interface device, such as via an application, may generate and share, such as via a cloud-based or social media service, one or more images, or short video clips, such as in response to user input. In some implementations, the user interface device, such as via an application, may remotely control the image capture device 100, such as in response to user input.

The user interface device, such as via an application, may display unprocessed or minimally processed images or video captured by the image capture device 100 contemporaneously with capturing the images or video by the image capture device 100, such as for shot framing, which may be referred to herein as a live preview, and which may be performed in response to user input. In some implementations, the user interface device, such as via an application, may mark one or more key moments contemporaneously with capturing the images or video by the image capture device 100, such as with a tag, such as in response to user input.

The user interface device, such as via an application, may display, or otherwise present, marks or tags associated with images or video, such as in response to user input. For example, marks may be presented in a camera roll application for location review and/or playback of video highlights.

The user interface device, such as via an application, may wirelessly control camera software, hardware, or both. For example, the user interface device may include a web-based graphical interface accessible by a user for selecting a live or previously recorded video stream from the image capture device 100 for display on the user interface device.

The user interface device may receive information indicating a user setting, such as an image resolution setting (e.g., 3840 pixels by 2160 pixels), a frame rate setting (e.g., 60 frames per second (fps)), a location setting, and/or a context setting, which may indicate an activity, such as mountain biking, in response to user input, and may communicate the settings, or related information, to the image capture device 100.

Figure 2A:
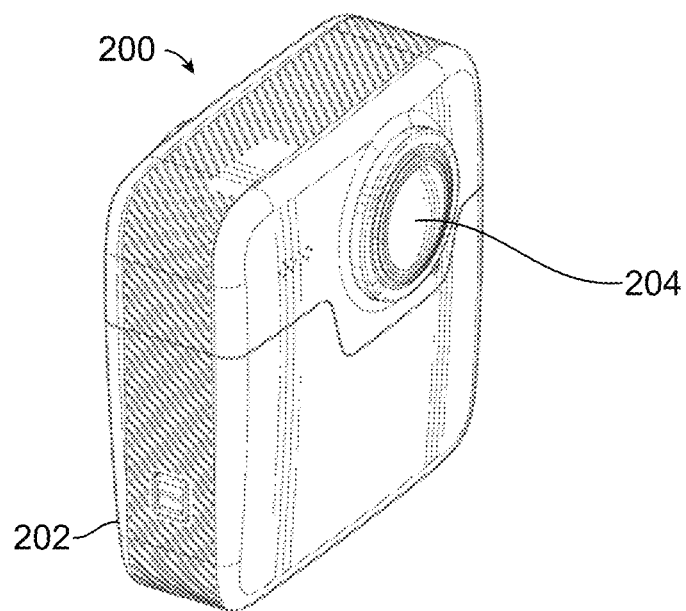
FIGS. 2A-B are isometric views of another example of an image capture device.
Figure 2B:
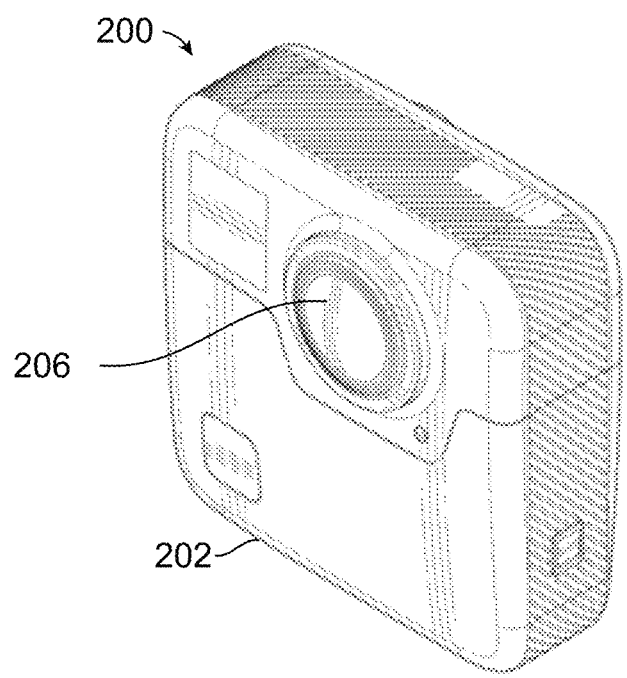

FIGS. 2A-B illustrate an image capture device 200 according to one embodiment. The image capture device 200 comprises a camera body 202 having two camera lenses 204, 206 structured on front and back surfaces of the camera body 202, various indicators on the front and/or back surface of the camera body 202 (such as LEDs, displays, and the like), various input mechanisms (such as buttons, switches, microphones, and touch-screen mechanisms), and electronics (e.g., imaging electronics, power electronics, etc.) internal to the camera body 202 for capturing images via the camera lenses 204, 206 and/or performing other functions. The two lenses 204, 206 are oriented in opposite directions and couple with two images sensors mounted on circuit boards (not shown). Other electrical camera components (e.g., an image processor, camera SoC (system-on-chip), etc.) may also be included on one or more circuit boards within the camera body 202 of the image capture device 200.

FIGS. 3A-B are block diagrams of examples of image capture systems. Referring first to FIG. 3A, an image capture system 300 is shown. The image capture system 300 includes an image capture device 310 (e.g., a camera or a drone), which may, for example, be the image capture device 100 shown in FIGS. 1A-D or the image capture device 200 shown in FIGS. 2A-B.

The image capture device 310 includes a processing apparatus 312 that is configured to receive a first image from the first image sensor 314 and receive a second image from the second image sensor 316. The processing apparatus 312 may be configured to perform image signal processing (e.g., filtering, tone mapping, stitching, and/or encoding) to generate output images based on image data from the image sensors 314 and 316. The image capture device 310 includes a communications interface 318 for transferring images to other devices. The image capture device 310 includes a user interface 320 to allow a user to control image capture functions and/or view images. The image capture device 310 includes a battery 322 for powering the image capture device 310. The components of the image capture device 310 may communicate with each other via the bus 324.

The processing apparatus 312 may include one or more processors having single or multiple processing cores. The processing apparatus 312 may include memory, such as a random-access memory device (RAM), flash memory, or another suitable type of storage device such as a non-transitory computer-readable memory. The memory of the processing apparatus 312 may include executable instructions and data that can be accessed by one or more processors of the processing apparatus 312. For example, the processing apparatus 312 may include one or more dynamic random access memory (DRAM) modules, such as double data rate synchronous dynamic random-access memory (DDR SDRAM). In some implementations, the processing apparatus 312 may include a digital signal processor (DSP). In some implementations, the processing apparatus 312 may include an application specific integrated circuit (ASIC). For example, the processing apparatus 312 may include a custom image signal processor.

The first image sensor 314 and the second image sensor 316 may be configured to detect light of a certain spectrum (e.g., the visible spectrum or the infrared spectrum) and convey information constituting an image as electrical signals (e.g., analog or digital signals). For example, the image sensors 314 and 316 may include CCDs or active pixel sensors in a CMOS. The image sensors 314 and 316 may detect light incident through a respective lens (e.g., a fisheye lens). In some implementations, the image sensors 314 and 316 include digital-to-analog converters. In some implementations, the image sensors 314 and 316 are held in a fixed orientation with respective fields of view that overlap.

The communications interface 318 may enable communications with a personal computing device (e.g., a smartphone, a tablet, a laptop computer, or a desktop computer). For example, the communications interface 318 may be used to receive commands controlling image capture and processing in the image capture device 310. For example, the communications interface 318 may be used to transfer image data to a personal computing device. For example, the communications interface 318 may include a wired interface, such as a high-definition multimedia interface (HDMI), a universal serial bus (USB) interface, or a FireWire interface. For example, the communications interface 318 may include a wireless interface, such as a Bluetooth interface, a ZigBee interface, and/or a Wi-Fi interface.

The user interface 320 may include an LCD display for presenting images and/or messages to a user. For example, the user interface 320 may include a button or switch enabling a person to manually turn the image capture device 310 on and off. For example, the user interface 320 may include a shutter button for snapping pictures.

The battery 322 may power the image capture device 310 and/or its peripherals. For example, the battery 322 may be charged wirelessly or through a micro-USB interface.

Referring next to FIG. 3B, another image capture system 330 is shown. The image capture system 330 includes an image capture device 340 and a personal computing device 360 that communicate via a communications link 350. The image capture device 340 may, for example, be the image capture device 100 shown in FIGS. 1A-D or the image capture device 200 shown in FIGS. 2A-B. The personal computing device 360 may, for example, be the user interface device described with respect to FIGS. 1A-D.

The image capture device 340 includes a first image sensor 342 and a second image sensor 344 that are configured to capture respective images. The image capture device 340 includes a communications interface 346 configured to transfer images via the communication link 350 to the personal computing device 360.

The personal computing device 360 includes a processing apparatus 362 that is configured to receive, using the communications interface 366, a first image from the first image sensor 342 and a second image from the second image sensor 344. The processing apparatus 362 may be configured to perform image signal processing (e.g., filtering, tone mapping, stitching, and/or encoding) to generate output images based on image data from the image sensors 342, 344.

The first image sensor 342 and the second image sensor 344 are configured to detect light of a certain spectrum (e.g., the visible spectrum or the infrared spectrum) and convey information constituting an image as electrical signals (e.g., analog or digital signals). For example, the image sensors 342 and 344 may include CCDs or active pixel sensors in a CMOS. The image sensors 342 and 344 may detect light incident through a respective lens (e.g., a fisheye lens). In some implementations, the image sensors 342 and 344 include digital-to-analog converters. In some implementations, the image sensors 342 and 344 are held in a fixed relative orientation with respective fields of view that overlap. Image signals from the image sensors 342 and 344 may be passed to other components of the image capture device 340 via a bus 348.

The communications link 350 may be a wired communications link or a wireless communications link. The communications interface 346 and the communications interface 366 may enable communications over the communications link 350. For example, the communications interface 346 and the communications interface 366 may include an HDMI port or other interface, a USB port or other interface, a FireWire interface, a Bluetooth interface, a ZigBee interface, and/or a Wi-Fi interface. For example, the communications interface 346 and the communications interface 366 may be used to transfer image data from the image capture device 340 to the personal computing device 360 for image signal processing (e.g., filtering, tone mapping, stitching, and/or encoding) to generate output images based on image data from the image sensors 342 and 344.

The processing apparatus 362 may include one or more processors having single or multiple processing cores. The processing apparatus 362 may include memory, such as RAM, flash memory, or another suitable type of storage device such as a non-transitory computer-readable memory. The memory of the processing apparatus 362 may include executable instructions and data that can be accessed by one or more processors of the processing apparatus 362. For example, the processing apparatus 362 may include one or more DRAM modules, such as DDR SDRAM.

In some implementations, the processing apparatus 362 may include a DSP. In some implementations, the processing apparatus 362 may include an integrated circuit, for example, an ASIC. For example, the processing apparatus 362 may include a custom image signal processor. The processing apparatus 362 may exchange data (e.g., image data) with other components of the personal computing device 360 via a bus 368.

The personal computing device 360 may include a user interface 364. For example, the user interface 364 may include a touchscreen display for presenting images and/or messages to a user and receiving commands from a user. For example, the user interface 364 may include a button or switch enabling a person to manually turn the personal computing device 360 on and off In some implementations, commands (e.g., start recording video, stop recording video, or snap photograph) received via the user interface 364 may be passed on to the image capture device 340 via the communications link 350. The image capture device 340 and/or the personal computing device 360 may be used to implement some or all of the techniques described in this disclosure.

Figure 4:
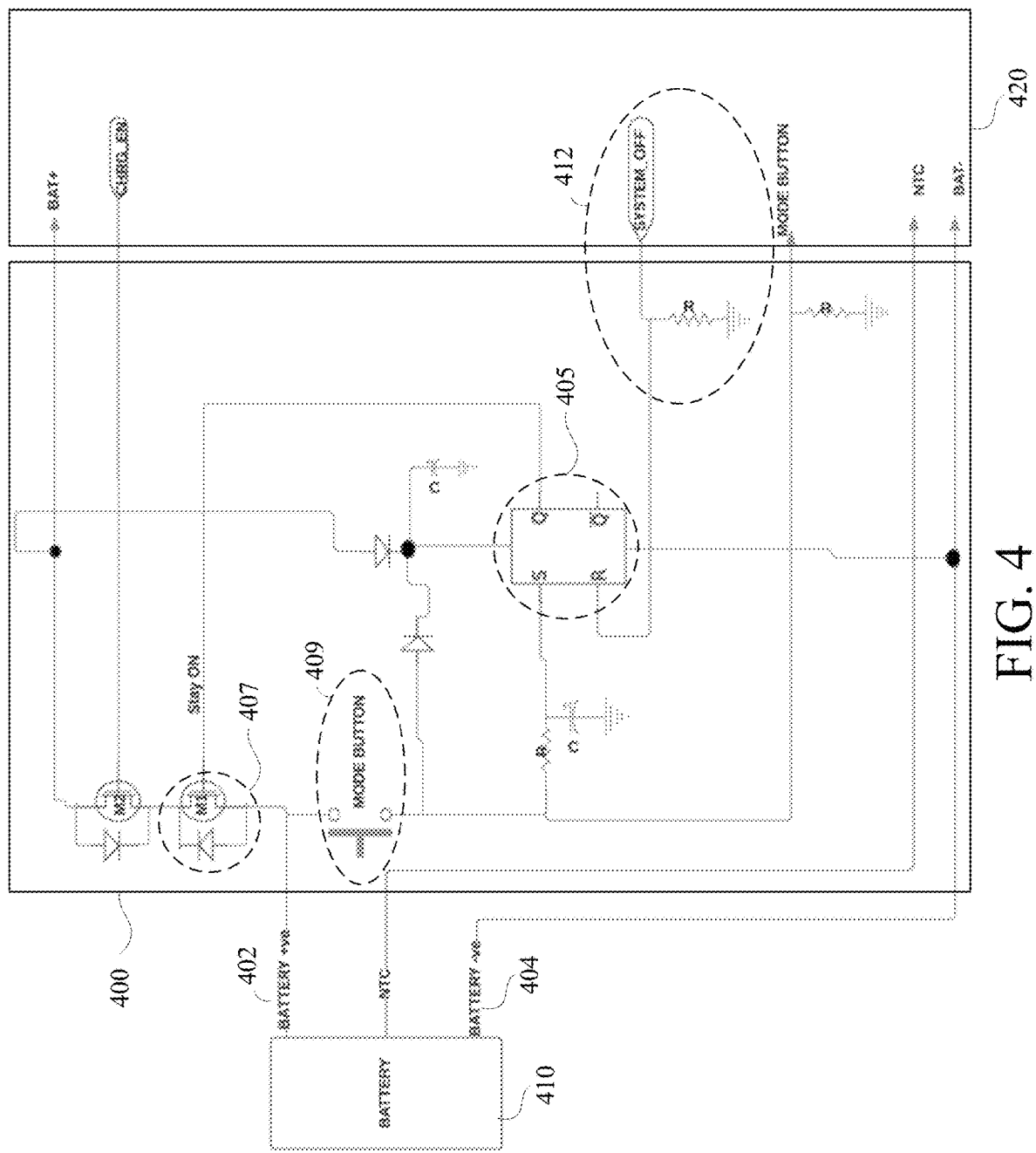
FIG. 4 is a diagram of an example of a battery-disconnect circuit in accordance with embodiments of this disclosure.

FIG. 4 is a diagram of an example of a battery-disconnect circuit 400 in accordance with embodiments of this disclosure. As shown in FIG. 4, the battery-disconnect circuit 400 is connected to a battery 410 and to circuitry 420 of an image capture device, such as image capture device 100 of FIGS. 1A-1D, image capture device 200 of FIGS. 2A-2B, image capture device 310 of FIG. 3A, or image capture device 340 of FIG. 3B. The battery 410 includes a positive terminal 402 and a negative terminal 404. The circuitry 420 may include processing apparatus 312 or processing apparatus 362 as shown in FIGS. 3A and 3B, respectively.

The battery-disconnect circuit 400 includes a latch 405, a battery-disconnect subcircuit 407, and a power-enable subcircuit 409. The battery-disconnect subcircuit 407 may be configured to control current leakage from the battery 410. A gate terminal of the battery-disconnect subcircuit 407 is connected to the latch 405. The latch 405 may be configured to maintain a power supply state and a no-power supply state of the battery-disconnect subcircuit 407. In an example, an enable signal may switch the battery-disconnect subcircuit 407 to the power supply state, and an off signal may switch the battery-disconnect subcircuit 407 to the no-power supply state.

The battery-disconnect subcircuit 407 may be configured to pass or block the battery voltage from being applied to the circuitry 420 of the image capture device. The battery-disconnect subcircuit 407 may include a p-type metal-oxide-semiconductor field-effect transistor (PMOS FET) or an n-type metal-oxide-semiconductor field-effect transistor (NMOS FET).

The power-enable subcircuit 409 may be connected to a power mode button of the image capture device. The power mode button may be used to signal a power supply state to the battery-disconnect circuit 400 to power on the battery-disconnect circuit 400 and enable battery power to the image capture device.

The latch 405 may be configured to maintain the battery-disconnect subcircuit 407 in an on state or an off state on a condition that the battery 410 is connected and supplying power. An output terminal Q of the latch 405 is connected to a gate terminal of the battery-disconnect subcircuit 407. An input terminal S of the latch 405 is connected to the power-enable subcircuit.

In an example, the battery-disconnect circuit 400 may include an on-off subcircuit 412. The on-off subcircuit 412 is connected to an input terminal R of the latch 405 and may be configured to control signals to the latch 405. For example, an on signal may be a pulse that sets the latch 405 and turns on the battery-disconnect subcircuit 407, and an off signal may be a pulse that clears the latch 405 and turns off the battery-disconnect subcircuit 407. The on-off subcircuit 412 may be configured to set the latch 405 and switch the battery-disconnect subcircuit 407 to the power supply state in response to an on signal. The on-off subcircuit 412 may be configured to clear the latch 405 and switch the battery-disconnect subcircuit 407 to the no-power supply state in response to an off signal.

Figure 5:
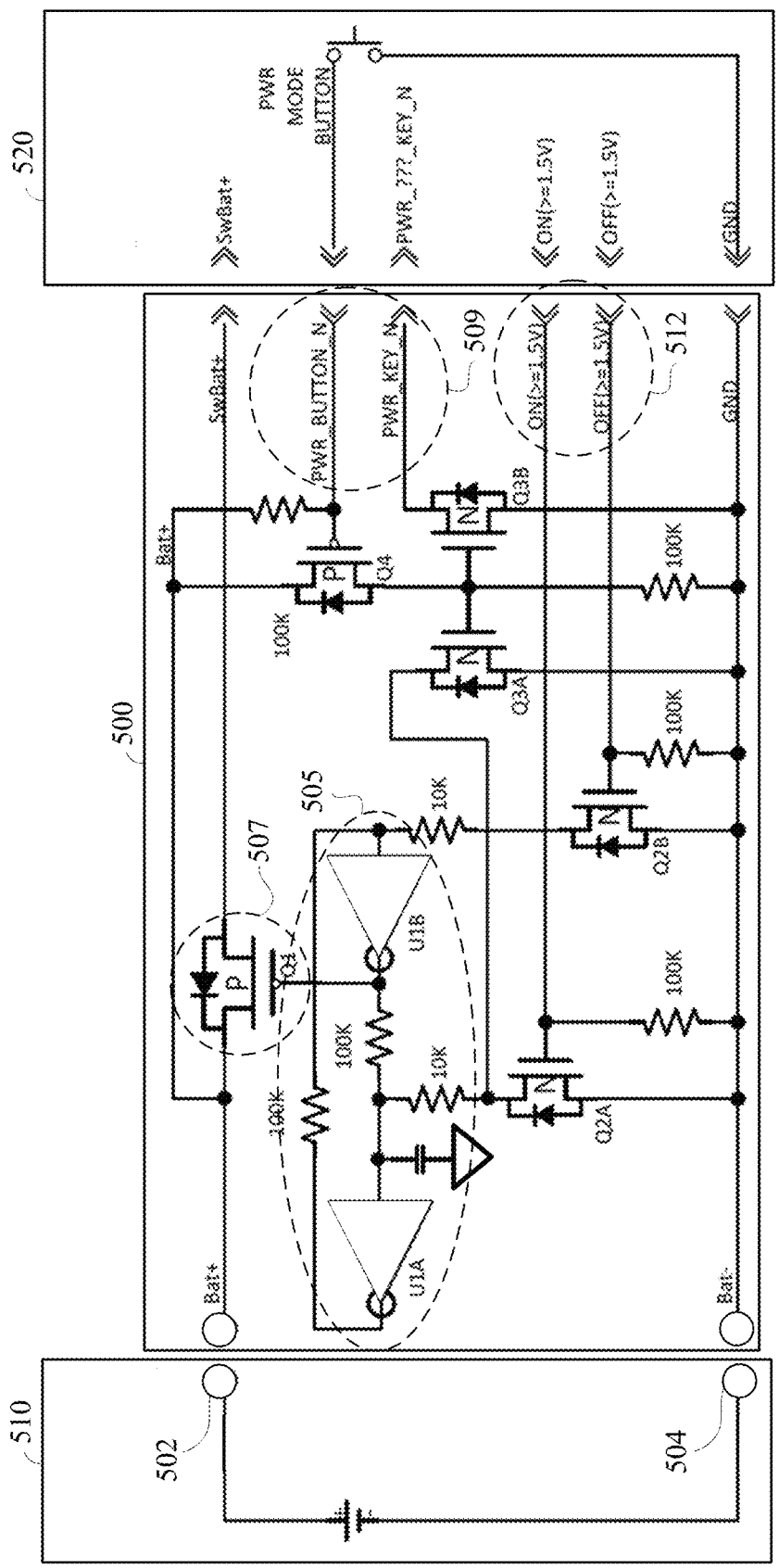
FIG. 5 is a diagram of another example of a battery-disconnect circuit in accordance with embodiments of this disclosure.

FIG. 5 is a diagram of another example of a battery-disconnect circuit 500 in accordance with embodiments of this disclosure. As shown in FIG. 5, the battery-disconnect circuit 500 is connected to a battery 510 and to circuitry 520 of an image capture device, such as image capture device 100 of FIGS. 1A-1D, image capture device 200 of FIGS. 2A-2B, image capture device 310 of FIG. 3A, or image capture device 340 of FIG. 3B. The battery 510 includes a positive terminal 502 and a negative terminal 504. The circuitry 520 may include processing apparatus 312 or processing apparatus 362 as shown in FIGS. 3A and 3B, respectively.

The battery-disconnect circuit 500 includes a latch 505, a battery-disconnect subcircuit 507, and a power-enable subcircuit 509. The battery-disconnect subcircuit 507 may be configured to control current leakage from the battery 510. A gate terminal of the battery-disconnect subcircuit 507 is connected to the latch 505. The latch 505 may be configured to maintain a power supply state and a no-power supply state of the battery-disconnect subcircuit 507. The power-enable subcircuit 509 is connected to a source terminal of the battery-disconnect subcircuit 507 and a ground. In an example, an enable signal may switch the battery-disconnect subcircuit 507 to the power supply state, and an off signal may switch the battery-disconnect subcircuit 507 to the no-power supply state.

The battery-disconnect subcircuit 507 may be configured to pass or block the battery voltage from being applied to the circuitry 520 of the image capture device. The battery-disconnect subcircuit 507 may include a PMOS FET Q1. A source terminal of the PMOS FET Q1 may be connected to the positive terminal 502 of the battery 510. A drain terminal of the PMOS FET Q1 may be connected to a positive terminal of the circuitry 520 of the image capture device. In an example, a charger voltage from the image capture device may pass through the PMOS FET Q1, via the parasitic diode, even if disabled. The PMOS FET Q1 may have a drain-source voltage (Vdss)≥12V, a threshold voltage (Vgsth)≤1.8V at 1 mA, and a drain-source on resistance (Rdson) ≤20 mohm at 1 A at gate-source voltage (Vgs)≥2.5V.

The power-enable subcircuit 509 may be connected to a power mode button of the image capture device. The power mode button may be used to signal a power supply state to the battery-disconnect circuit 500 to power on the battery-disconnect circuit 500 and enable battery power to the image capture device. The power-enable subcircuit 509 may be connected to a level shifting buffer. The level shifting buffer may interface with the image capture device power mode button and translate a control signal to set the latch 505 to an on state and to indicate power mode button functionality. The level shifting buffer may include a PMOS FET Q4, a first NMOS FET Q3A and a second NMOS FET Q3B. A gate terminal of the first NMOS FET Q3A may be connected to a gate terminal of the second NMOS FET Q3B. A gate terminal of the PMOS FET Q4 may be connected to the power button of the image capture device. The source terminal of the PMOS FET Q4 may be connected to the source terminal of the PMOS FET Q1, the positive terminal 502 of the battery 510, and the power mode button of the image capture device. A drain terminal of the PMOS FET Q4 may be connected to the gate terminal of the first NMOS FET Q3A and the gate terminal of the second NMOS FET Q3B. The source terminal of the NMOS FET Q3A and the source terminal of the NMOS FET Q3B are connected to ground. The dual NMOS FETs Q3A, Q3B may have a Vdss≥12V and Vgsth≥1.5V at 1 mA. The PMOS FET Q4 may have a Vdss≥12V and a Vgsth≥2.5V at 1 mA.

The latch 505 may be configured to maintain the battery-disconnect subcircuit 507 in an on state or an off state on a condition that the battery 510 is connected and supplying power. The latch 505 comprises a first inverter U1A and a second inverter U1B. An input terminal of the first inverter U1A is connected to a capacitor. An output terminal of the second inverter U1B is connected to a gate terminal of the PMOS FET Q1. An input terminal of the second inverter U1B is connected to the output terminal of the first inverter U1A. The input terminal of the first inverter U1A and the output terminal of the second inverter U1B may be connected to the level shifting buffer via the drain terminal of the first NMOS FET Q3A. In this example, a U1B output low may enable the battery-disconnect subcircuit 507, and a U1B output high may disable the battery-disconnect subcircuit 507. The first inverter U1A and second inverter U1B may have a common collector voltage (Vcc)≥4.6V and a maximum rated conditional short-circuit current (Icc max) <1 µA (at 25° C.).

In an example, the battery-disconnect circuit 500 may include an on-off subcircuit 512. The on-off subcircuit 512 may be connected to a signal level shifting inverter configured to control signals to the latch 505. For example, an on signal may be a pulse that sets the latch 505 and turns on the battery-disconnect subcircuit 507, and an off signal may be a pulse that clears the latch 505 and turns off the battery-disconnect subcircuit 507. The signal level shifting inverter may be configured to set the latch 505 and switch the battery-disconnect subcircuit 507 to the power supply state in response to an on signal. The signal level shifting inverter may be configured to clear the latch 505 and switch the battery-disconnect subcircuit 507 to the no-power supply state in response to an off signal.

The signal level shifting inverter may be referred to as on-off signal level shifting inverters. For example, as shown in FIG. 5, the on-off signal level shifting inverters may include a first NMOS FET Q2A and a second NMOS FET Q2B. An on terminal of the on-off subcircuit 512 may be connected to a gate terminal of the first NMOS FET Q2A. An off terminal of the on-off subcircuit 512 may be connected to a gate terminal of the second NMOS FET Q2B. A drain terminal of the first NMOS FET Q2A is connected to the latch 505, for example via the input terminal of the first inverter U1A and the output terminal of the second inverter U1B. The on-off subcircuit may be configured to control current leakage of the battery 510. For example, an on signal may switch the battery-disconnect subcircuit 500 to a power supply state, and an off signal may switch the battery-disconnect subcircuit 500 to a no-power supply state. The dual NMOS FETs Q2A, Q2B may have a Vdss≥12V and a Vgsth≥1.5V at 1 mA.

Figure 6:
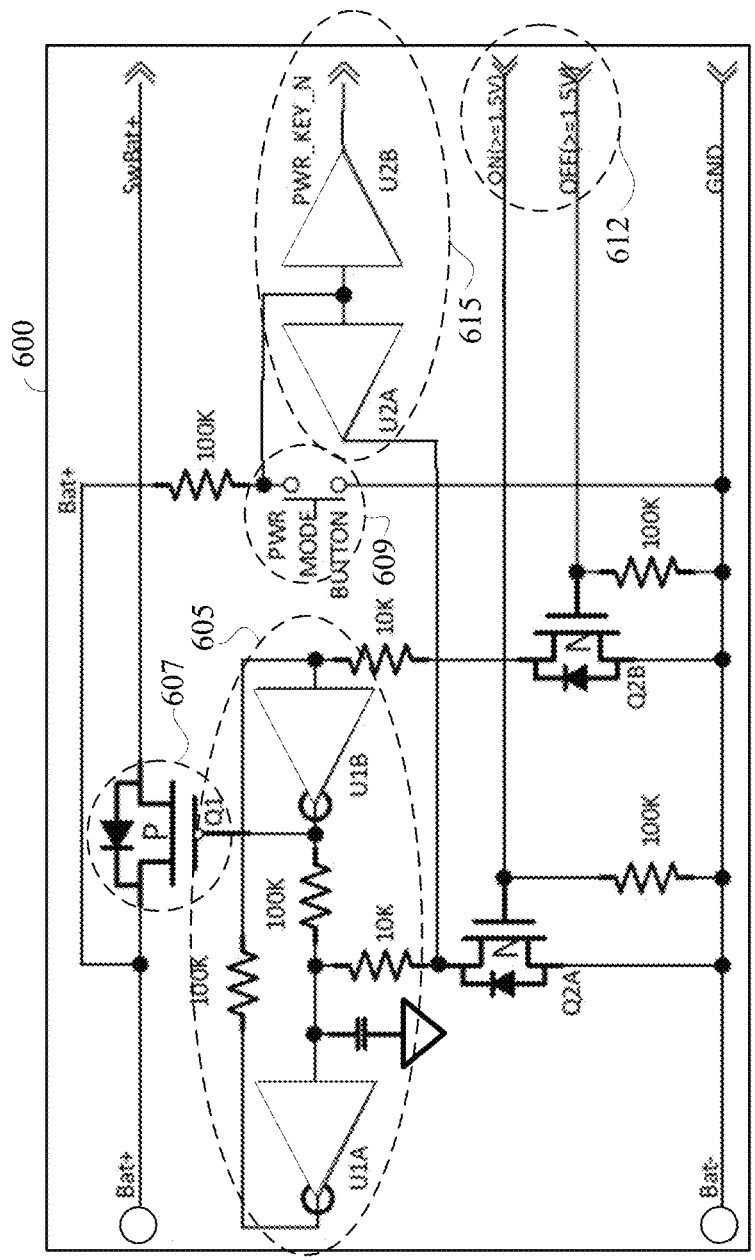
FIG. 6 is a diagram of an example of a battery-disconnect circuit with level shifting buffers in accordance with embodiments of this disclosure.

FIG. 6 is a diagram of an example of a battery-disconnect circuit 600 with level shifting buffers in accordance with embodiments of this disclosure. The battery 510 and the circuitry 520 of FIG. 5 are not shown in FIG. 6 for simplicity and clarity.

The battery-disconnect circuit 600 includes a latch 605, a battery-disconnect subcircuit 607, and a power-enable subcircuit 609. The battery-disconnect subcircuit 607 may be configured to control current leakage from the battery. A gate terminal of the battery-disconnect subcircuit 607 is connected to the latch 605. The latch 605 may be configured to maintain a power supply state and a no-power supply state of the battery-disconnect subcircuit 607. The power-enable subcircuit 609 is connected to a source terminal of the battery-disconnect subcircuit 607 and a ground. In an example, an enable signal may switch the battery-disconnect subcircuit 607 to the power supply state, and an off signal may switch the battery-disconnect subcircuit 607 to the no-power supply state.

The battery-disconnect subcircuit 607 may be configured to pass or block the battery voltage from being applied to the circuitry of the image capture device. The battery-disconnect subcircuit 607 may include a PMOS FET Q1. A source terminal of the PMOS FET Q1 may be connected to the positive terminal of the battery. A drain terminal of the PMOS FET Q1 may be connected to a positive terminal of the circuitry of the image capture device. In an example, a charger voltage from the image capture device may pass through the PMOS FET Q1, via the parasitic diode, even if disabled.

The latch 605 may be configured to maintain the battery-disconnect subcircuit 607 in an on state or an off state on a condition that the battery is connected and supplying power. The latch 605 comprises a first inverter U1A and a second inverter U1B. An input terminal of the first inverter U1A is connected to a capacitor. An output terminal of the second inverter U1B is connected to a gate terminal of the PMOS FET Q1. An input terminal of the second inverter U1B is connected to the output terminal of the first inverter U1A. The input terminal of the first inverter U1A and the output terminal of the second inverter U1B may be connected to the level shifting buffer via the drain terminal of the first NMOS FET Q3A. In this example, a U1B output low may enable the battery-disconnect subcircuit 607, and a U1B output high may disable the battery-disconnect subcircuit 607.

In an example, the battery-disconnect circuit 600 may include an on-off subcircuit 612. The on-off subcircuit 612 may be connected to a signal level shifting inverter configured to control signals to the latch 605. For example, an on signal may be a pulse that sets the latch 605 and turns on the battery-disconnect subcircuit 607, and an off signal may be a pulse that clears the latch 605 and turns off the battery-disconnect subcircuit 607. The signal level shifting inverter may be configured to set the latch 605 and switch the battery-disconnect subcircuit 607 to the power supply state in response to an on signal. The signal level shifting inverter may be configured to clear the latch 605 and switch the battery-disconnect subcircuit 607 to the no-power supply state in response to an off signal.

The signal level shifting inverter may be referred to as on-off signal level shifting inverters. For example, as shown in FIG. 6, the on-off signal level shifting inverters may include a first NMOS FET Q2A and a second NMOS FET Q2B. An on terminal of the on-off subcircuit 612 may be connected to a gate terminal of the first NMOS FET Q2A. An off terminal of the on-off subcircuit 612 may be connected to a gate terminal of the second NMOS FET Q2B. A drain terminal of the first NMOS FET Q2A is connected to the latch 605, for example via the input terminal of the first inverter U1A and the output terminal of the second inverter U1B. The on-off subcircuit 612 may be configured to control current leakage of the battery. For example, an on signal may switch the battery-disconnect subcircuit 600 to a power supply state, and an off signal may switch the battery-disconnect subcircuit 600 to a no-power supply state.

The power-enable subcircuit 609 may be connected to a power mode button of the image capture device. The power mode button may be used to signal a power supply state to the battery-disconnect circuit 600 to power on the battery-disconnect circuit 600 and enable battery power to the image capture device. The power-enable subcircuit 609 may be connected to a power button level shifting buffer 615. The power button level shifting buffer 615 may interface with the image capture device power mode button and translate a control signal to set the latch 605 to an on state and to indicate power mode button functionality. The power button level shifting buffer 615 may be a dual open drain buffer. For example, the power button level shifting buffer 615 may include a first inverter U2A and a second inverter U2B. An output terminal of the first inverter U2A is connected to a drain terminal of the first NMOS FET Q2A and the latch 605, for example via the input terminal of the first inverter U1A and the output terminal of the second inverter U1B. The output terminal of the first inverter U2A is connected to the power-enable subcircuit 609 and an input terminal of the second inverter U2B. An output terminal of the second inverter U2B is connected to an interface of the image capture device. The dual open drain buffer U2A, U2B may have a Vcc≥4.6V and an Icc max<1 µA (at 25° C.).

Figure 7:
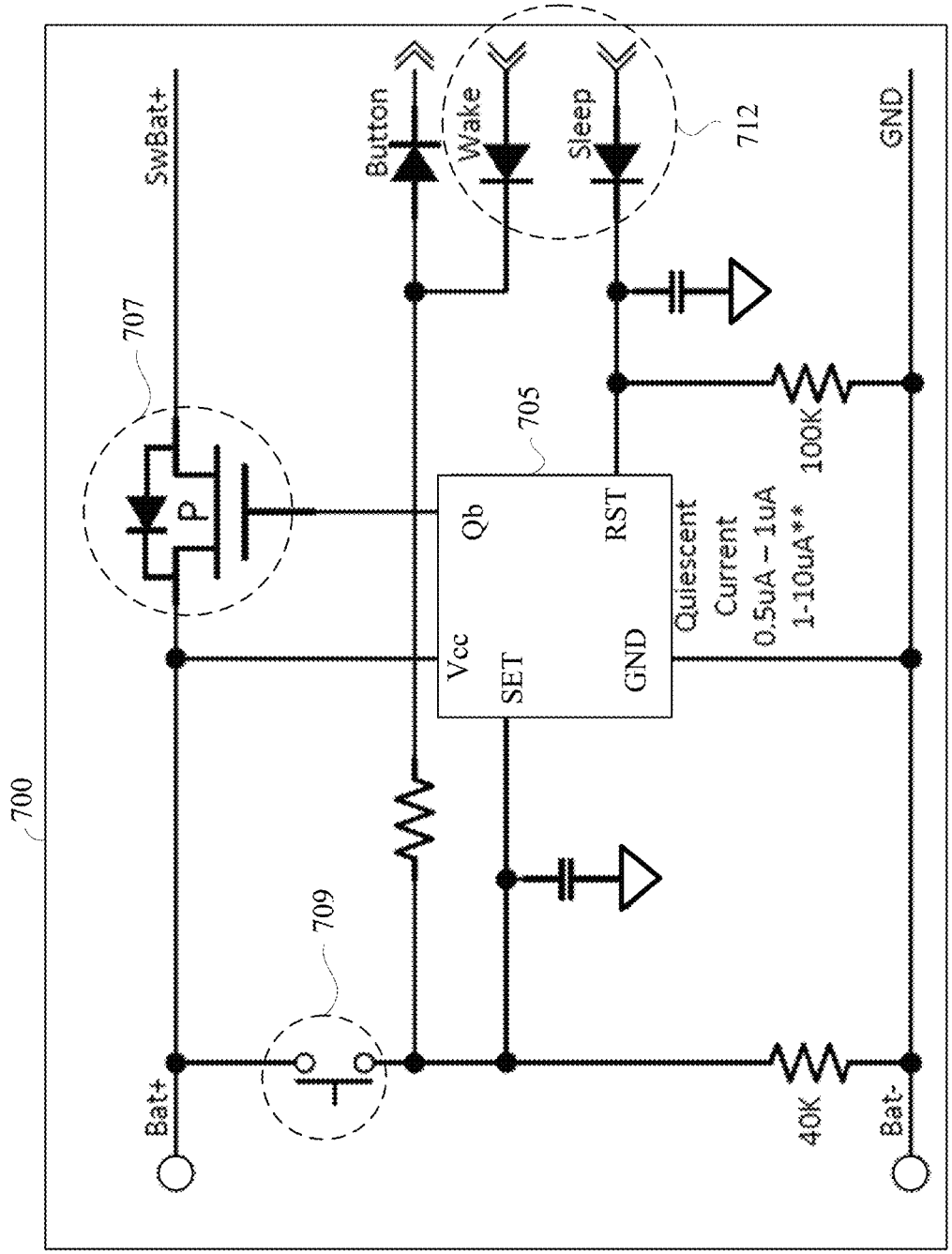
FIG. 7 is a diagram of an example of a battery-disconnect circuit with a NOR S/R latch in accordance with embodiments of this disclosure.

FIG. 7 is a diagram of an example of a battery-disconnect circuit 700 with an NOR S/R latch in accordance with embodiments of this disclosure. The battery 510 and the circuitry 520 of FIG. 5 are not shown in FIG. 7 for simplicity and clarity.

The battery-disconnect circuit 700 includes a latch 705, a battery-disconnect subcircuit 707, and a power-enable subcircuit 709. The battery-disconnect subcircuit 707 may be configured to control current leakage from the battery. A gate terminal of the battery-disconnect subcircuit 707 is connected to the latch 705. The latch 705 may be configured to maintain a power supply state and a no-power supply state of the battery-disconnect subcircuit 707. The power-enable subcircuit 709 is connected to a source terminal of the battery-disconnect subcircuit 707, the negative terminal of the battery, and a ground. In an example, an enable signal may switch the battery-disconnect subcircuit 707 to the power supply state, and an off signal may switch the battery-disconnect subcircuit 707 to the no-power supply state.

The battery-disconnect subcircuit 707 may be configured to pass or block the battery voltage from being applied to the circuitry of the image capture device. The battery-disconnect subcircuit 707 may include a PMOS FET. A source terminal of the PMOS FET may be connected to the positive terminal of the battery. A drain terminal of the PMOS FET may be connected to a positive terminal of the circuitry of the image capture device. In an example, a charger voltage from the image capture device may pass through the PMOS FET, via the parasitic diode, even if disabled.

The latch 705 may be configured to maintain the battery-disconnect subcircuit 707 in an on state or an off state on a condition that the battery is connected and supplying power. The latch 705 may be a NOR set/reset (S/R) latch. A Vcc terminal of the latch 705 is connected to the source terminal of the PMOS FET. An input terminal Qb of the latch 705 is connected to the gate of the PMOS FET. A SET terminal of the latch 705 is connected to the power-enable subcircuit 709, the negative terminal of the battery, and the ground.

In an example, the battery-disconnect circuit 700 may include an on-off subcircuit 712. The on-off subcircuit 712 may be connected to an RST terminal of the latch 705. For example, an on signal may be a pulse that sets the latch 705 and turns on the battery-disconnect subcircuit 707, and an off signal may be a pulse that clears the latch 705 and turns off the battery-disconnect subcircuit 707. The on-off subcircuit 712 may be configured to set the latch 705 and switch the battery-disconnect subcircuit 707 to the power supply state in response to an on signal. The on-off subcircuit 712 may be configured to clear the latch 705 and switch the battery-disconnect subcircuit 707 to the no-power supply state in response to an off signal.

The power-enable subcircuit 709 may be connected to a power mode button of the image capture device. The power mode button may be used to signal a power supply state to the battery-disconnect circuit 700 to power on the battery-disconnect circuit 700 and enable battery power to the image capture device.

Figure 8:
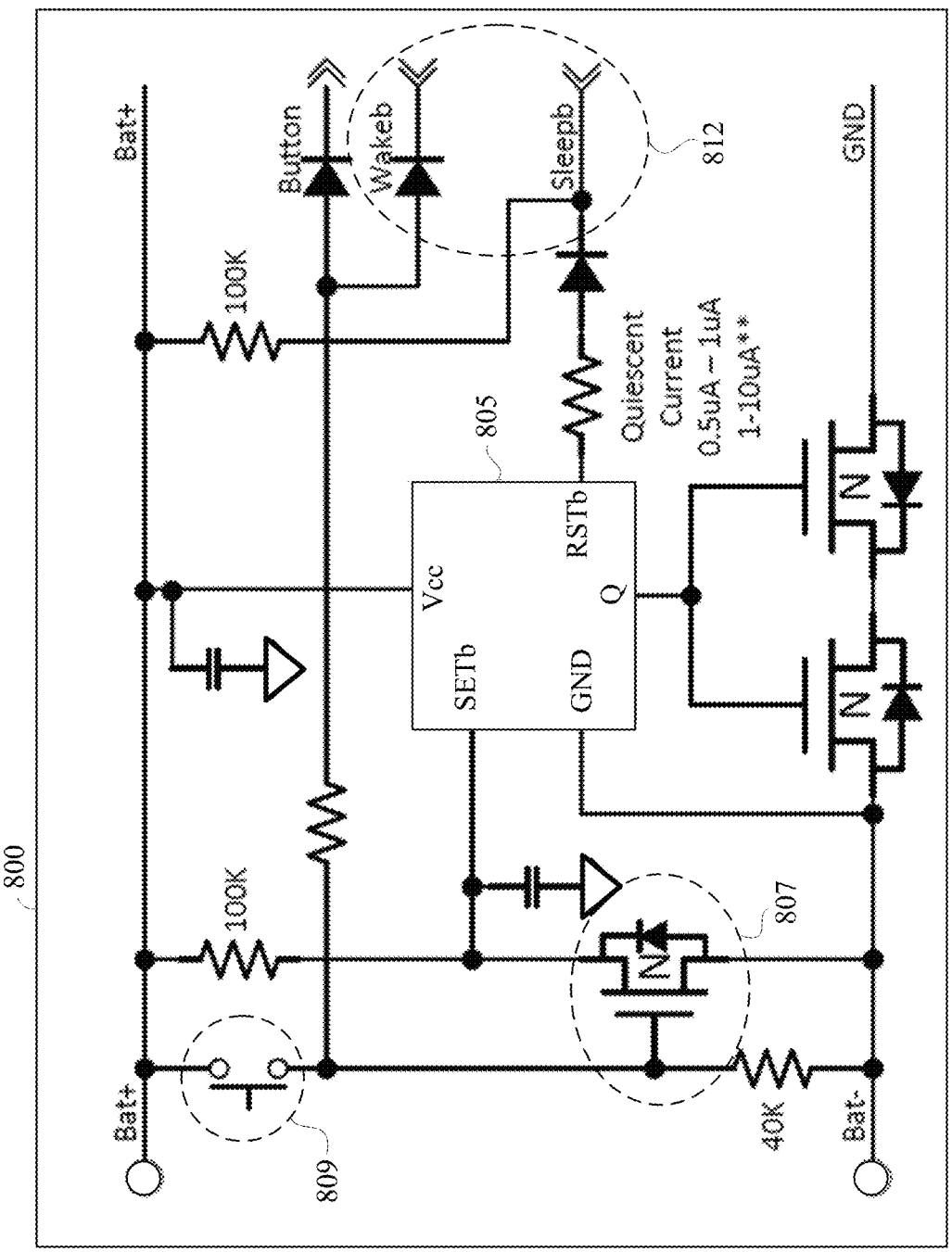
FIG. 8 is a diagram of an example of a battery-disconnect circuit with a NAND S/R latch in accordance with embodiments of this disclosure.

FIG. 8 is a diagram of an example of a battery-disconnect circuit 800 with a NAND S/R latch in accordance with embodiments of this disclosure. The battery 510 and the circuitry 520 of FIG. 5 are not shown in FIG. 8 for simplicity and clarity.

The battery-disconnect circuit 800 includes a latch 805, a battery-disconnect subcircuit 807, and a power-enable subcircuit 809. The battery-disconnect subcircuit 807 may be configured to control current leakage from the battery. A drain terminal of the battery-disconnect subcircuit 807 is connected to the latch 805. The latch 805 may be configured to maintain a power supply state and a no-power supply state of the battery-disconnect subcircuit 807. The power-enable subcircuit 809 is connected to a gate terminal of the battery-disconnect subcircuit 807, the positive terminal of the battery, and an on-off subcircuit 812. In an example, an enable signal may switch the battery-disconnect subcircuit 807 to the power supply state, and an off signal may switch the battery-disconnect subcircuit 807 to the no-power supply state.

The battery-disconnect subcircuit 807 may be configured to pass or block the battery voltage from being applied to the circuitry of the image capture device. The battery-disconnect subcircuit 807 may include an NMOS FET. A source terminal of the NMOS FET may be connected to the negative terminal of the battery. A drain terminal of the NMOS FET may be connected to the positive terminal of the battery and the latch 805. In an example, a charger voltage from the image capture device may pass through the NMOS FET, via the parasitic diode, even if disabled.

The latch 805 may be configured to maintain the battery-disconnect subcircuit 807 in an on state or an off state on a condition that the battery is connected and supplying power. The latch 805 may be a NAND S/R latch. A Vcc terminal of the latch 805 is connected to the positive terminal of the battery. An input terminal Q of the latch 805 is connected to a gate terminal of a first NMOS FET and a gate terminal of a second NMOS FET. The drain terminal of the first NMOS FET may be connected to the drain terminal of the second NMOS FET. The source terminal of the first NMOS FET may be connected to the source terminal of the NMOS FET of the battery-disconnect subcircuit 807. A SETb terminal of the latch 805 is connected to the power-enable subcircuit 809, the drain terminal of the NMOS FET of the battery-disconnect subcircuit 807.

In an example, the battery-disconnect circuit 800 may include an on-off subcircuit 812. The on-off subcircuit 812 may be connected to an RSTb terminal of the latch 805. For example, an on signal may be a pulse that sets the latch 805 and turns on the battery-disconnect subcircuit 807, and an off signal may be a pulse that clears the latch 805 and turns off the battery-disconnect subcircuit 807. The on-off subcircuit 812 may be configured to set the latch 805 and switch the battery-disconnect subcircuit 807 to the power supply state in response to an on signal. The on-off subcircuit 812 may be configured to clear the latch 805 and switch the battery-disconnect subcircuit 807 to the no-power supply state in response to an off signal.

The power-enable subcircuit 809 may be connected to a power mode button of the image capture device. The power mode button may be used to signal a power supply state to the battery-disconnect circuit 800 to power on the battery-disconnect circuit 800 and enable battery power to the image capture device.

Figure 9:
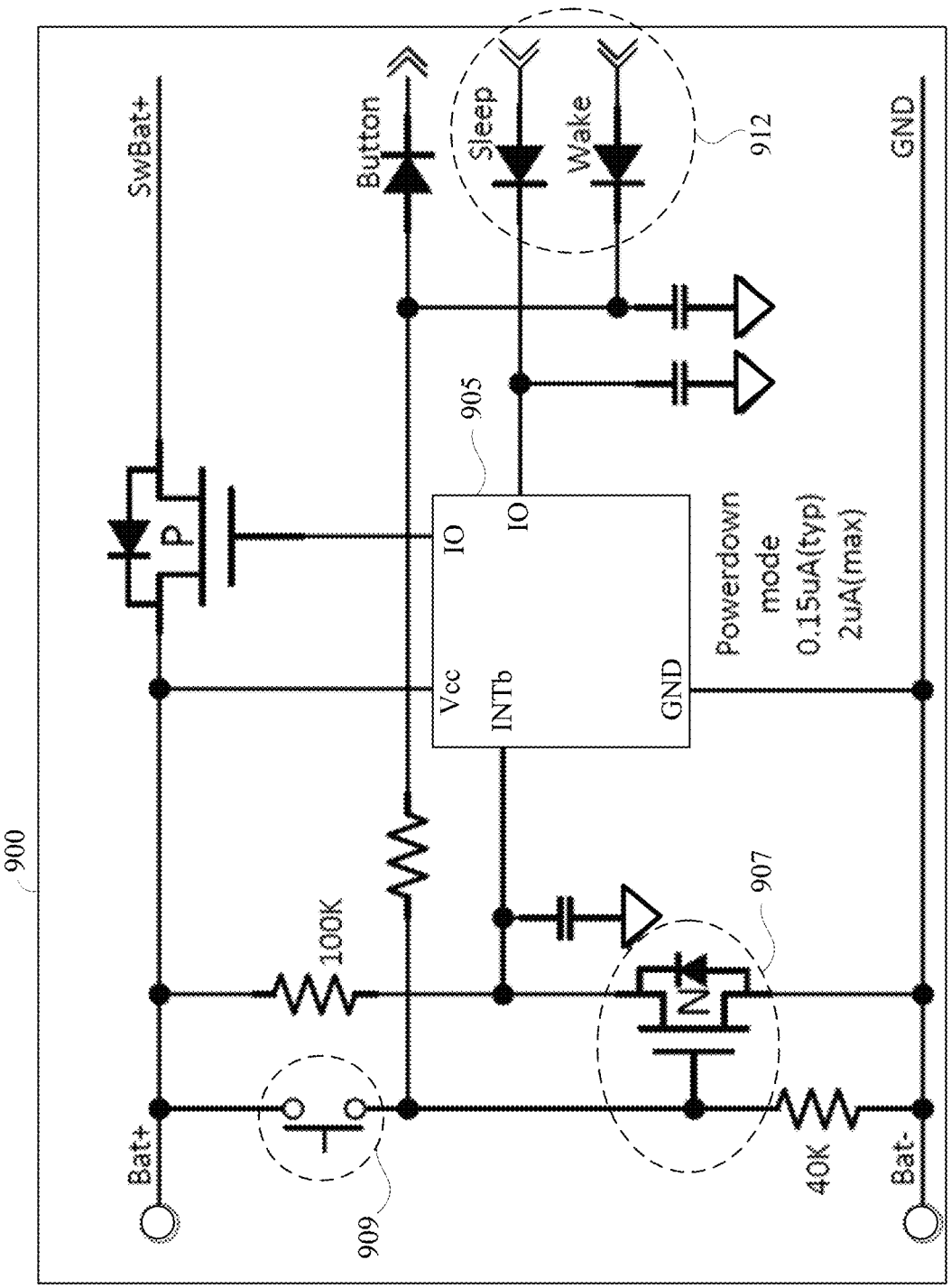
FIG. 9 is a diagram of an example of a battery-disconnect circuit with a microcontroller in accordance with embodiments of this disclosure.

FIG. 9 is a diagram of an example of a battery-disconnect circuit 900 with a microcontroller in accordance with embodiments of this disclosure. The battery 510 and the circuitry 520 of FIG. 5 are not shown in FIG. 9 for simplicity and clarity.

The battery-disconnect circuit 900 includes a microcontroller 905, a battery-disconnect subcircuit 907, and a power-enable subcircuit 909. The battery-disconnect subcircuit 907 may be configured to control current leakage from the battery. A drain terminal of the battery-disconnect subcircuit 907 is connected to the microcontroller 905. The microcontroller 905 may be configured to maintain a power supply state and a no-power supply state of the battery-disconnect subcircuit 907. The power-enable subcircuit 909 is connected to a gate terminal of the battery-disconnect subcircuit 907, the positive terminal of the battery, and an on-off subcircuit 912. In an example, an enable signal may switch the battery-disconnect subcircuit 907 to the power supply state, and an off signal may switch the battery-disconnect subcircuit 907 to the no-power supply state.

The battery-disconnect subcircuit 907 may be configured to pass or block the battery voltage from being applied to the circuitry of the image capture device. The battery-disconnect subcircuit 907 may include an NMOS FET. A source terminal of the NMOS FET may be connected to the negative terminal of the battery. A drain terminal of the NMOS FET may be connected to the positive terminal of the battery and the microcontroller 905. In an example, a charger voltage from the image capture device may pass through the NMOS FET, via the parasitic diode, even if disabled.

The microcontroller 905 may be configured to maintain the battery-disconnect subcircuit 907 in an on state or an off state on a condition that the battery is connected and supplying power. A Vcc terminal of the microcontroller 905 is connected to the positive terminal of the battery. A first input/output (IO) terminal of the microcontroller 905 is connected to a gate terminal of a PMOS FET.

In an example, the battery-disconnect circuit 900 may include an on-off subcircuit 912. The on-off subcircuit 912 may be connected to a second IO terminal of the microcontroller 905. For example, an on signal may be a pulse that sets the latch 805 and turns on the battery-disconnect subcircuit 907, and an off signal may be a pulse that clears the microcontroller 905 and turns off the battery-disconnect subcircuit 907. The on-off subcircuit 912 may be configured to set the latch 905 and switch the battery-disconnect subcircuit 907 to the power supply state in response to an on signal. The on-off subcircuit 912 may be configured to clear the microcontroller 905 and switch the battery-disconnect subcircuit 907 to the no-power supply state in response to an off signal.

The power-enable subcircuit 909 may be connected to a power mode button of the image capture device. The power mode button may be used to signal a power supply state to the battery-disconnect circuit 900 to power on the battery-disconnect circuit 900 and enable battery power to the image capture device.

Figure 10:
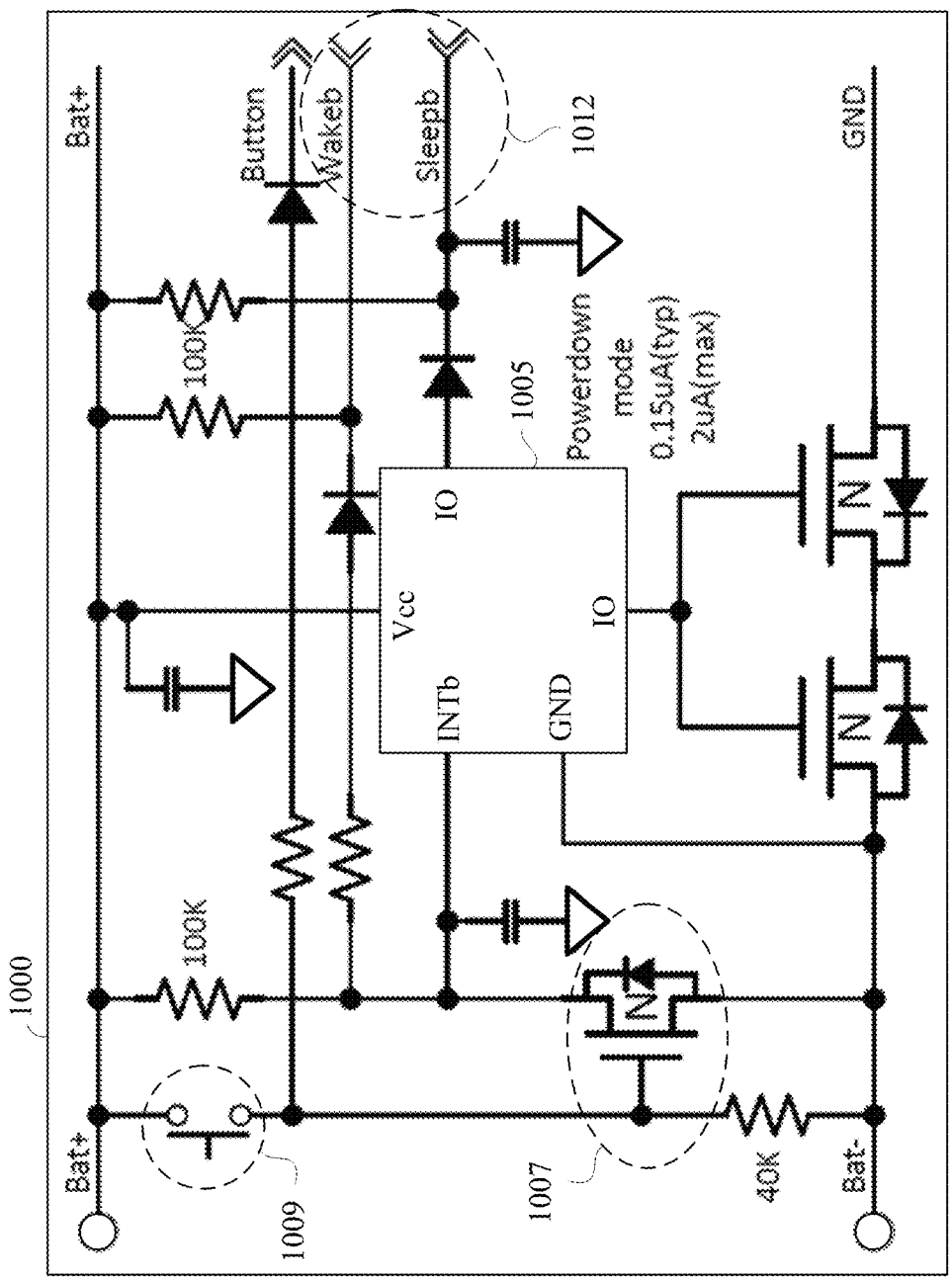
FIG. 10 is a diagram of another example of a battery-disconnect circuit with a microcontroller in accordance with embodiments of this disclosure.

FIG. 10 is a diagram of another example of a battery-disconnect circuit 1000 with a microcontroller in accordance with embodiments of this disclosure. The battery 510 and the circuitry 520 of FIG. 5 are not shown in FIG. 10 for simplicity and clarity.

The battery-disconnect circuit 1000 includes a microcontroller 1005, a battery-disconnect subcircuit 1007, and a power-enable subcircuit 1009. The battery-disconnect subcircuit 1007 may be configured to control current leakage from the battery. A drain terminal of the battery-disconnect subcircuit 1007 is connected to the microcontroller 1005. The microcontroller 1005 may be configured to maintain a power supply state and a no-power supply state of the battery-disconnect subcircuit 1007. The power-enable subcircuit 1009 is connected to a gate terminal of the battery-disconnect subcircuit 1007, the positive terminal of the battery, and an on-off subcircuit 1012. In an example, an enable signal may switch the battery-disconnect subcircuit 1007 to the power supply state, and an off signal may switch the battery-disconnect subcircuit 1007 to the no-power supply state.

The battery-disconnect subcircuit 1007 may be configured to pass or block the battery voltage from being applied to the circuitry of the image capture device. The battery-disconnect subcircuit 1007 may include an NMOS FET. A source terminal of the NMOS FET may be connected to the negative terminal of the battery. A drain terminal of the NMOS FET may be connected to the positive terminal of the battery and the microcontroller 1005. In an example, a charger voltage from the image capture device may pass through the NMOS FET, via the parasitic diode, even if disabled.

The microcontroller 1005 may be configured to maintain the battery-disconnect subcircuit 1007 in an on state or an off state on a condition that the battery is connected and supplying power. A Vcc terminal of the microcontroller 1005 is connected to the positive terminal of the battery. A first IO terminal of the microcontroller 1005 is connected to a gate terminal of a first NMOS FET and a gate terminal of a second NMOS FET. The drain terminal of the first NMOS FET may be connected to the drain terminal of the second NMOS FET. The source terminal of the first NMOS FET may be connected to the source terminal of the NMOS FET of the battery-disconnect subcircuit 1007.

In an example, the battery-disconnect circuit 1000 may include an on-off subcircuit 1012. The on-off subcircuit 1012 may be connected to a second IO terminal of the microcontroller 1005. For example, an on signal may be a pulse that sets the microcontroller 1005 and turns on the battery-disconnect subcircuit 1007, and an off signal may be a pulse that clears the latch 1005 and turns off the battery-disconnect subcircuit 1007. The on-off subcircuit 1012 may be configured to set the latch 1005 and switch the battery-disconnect subcircuit 1007 to the power supply state in response to an on signal. The on-off subcircuit 1012 may be configured to clear the microcontroller 1005 and switch the battery-disconnect subcircuit 1007 to the no-power supply state in response to an off signal.

The power-enable subcircuit 1009 may be connected to a power mode button of the image capture device. The power mode button may be used to signal a power supply state to the battery-disconnect circuit 1000 to power on the battery-disconnect circuit 1000 and enable battery power to the image capture device.

Figure 11:
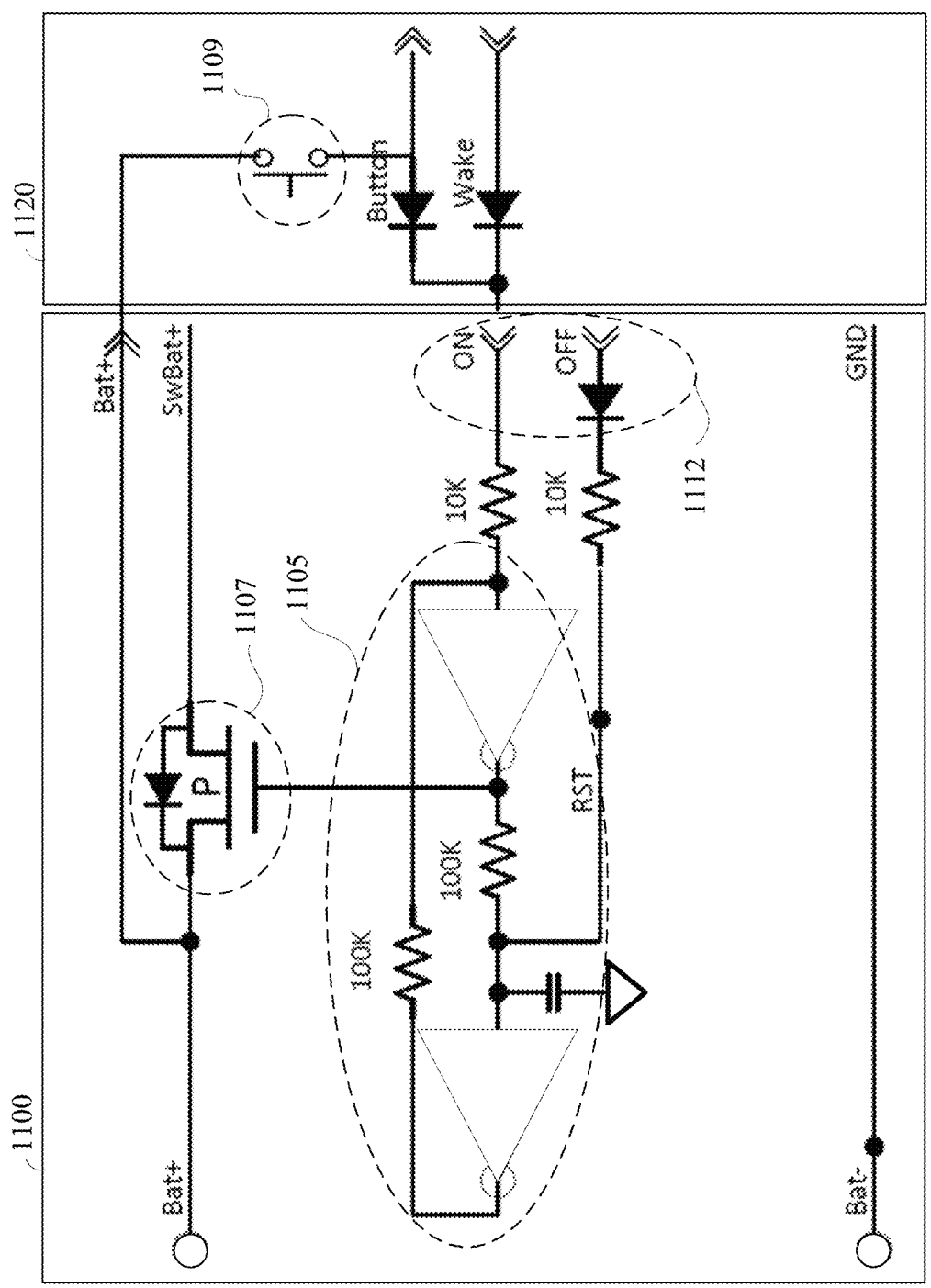
FIG. 11 is a diagram of an example of a battery-disconnect circuit with an inverter in accordance with embodiments of this disclosure.

FIG. 11 is a diagram of an example of a battery-disconnect circuit 1100 with an inverter in accordance with embodiments of this disclosure. As shown in FIG. 11, the battery-disconnect circuit 1100 is connected to circuitry 1120 of an image capture device, such as image capture device 100 of FIGS. 1A-1D, image capture device 200 of FIGS. 2A-2B, image capture device 310 of FIG. 3A, or image capture device 340 of FIG. 3B. The circuitry 520 may include processing apparatus 312 or processing apparatus 362 as shown in FIGS. 3A and 3B, respectively. A battery is not shown for simplicity and clarity.

The battery-disconnect circuit 1100 includes a latch 1105, a battery-disconnect subcircuit 1107, and an on-off subcircuit 1112. The battery-disconnect subcircuit 1107 may be configured to control current leakage from the battery. A gate terminal of the battery-disconnect subcircuit 1107 is connected to the latch 1105. The latch 1105 may be configured to maintain a power supply state and a no-power supply state of the battery-disconnect subcircuit 1107. The on-off subcircuit 1112 is connected to a source terminal of the battery-disconnect subcircuit 1107 via a power-enable subcircuit 1109 of the circuitry 1120. In an example, an enable signal may switch the battery-disconnect subcircuit 1107 to the power supply state, and an off signal may switch the battery-disconnect subcircuit 1107 to the no-power supply state.

The battery-disconnect subcircuit 1107 may be configured to pass or block the battery voltage from being applied to the circuitry 1120 of the image capture device. The battery-disconnect subcircuit 1107 may include a PMOS FET. A source terminal of the PMOS FET may be connected to the positive terminal of the battery. A drain terminal of the PMOS FET may be connected to a positive terminal of the circuitry 1120 of the image capture device. In an example, a charger voltage from the image capture device may pass through the PMOS FET, via the parasitic diode, even if disabled.

The power-enable subcircuit 1109 may be connected to a power mode button of the image capture device. The power mode button may be used to signal a power supply state to the battery-disconnect circuit 1100 to power on the battery-disconnect circuit 1100 and enable battery power to the image capture device.

The latch 1105 may be configured to maintain the battery-disconnect subcircuit 1107 in an on state or an off state on a condition that the battery is connected and supplying power. The latch 1105 comprises a first inverter and a second inverter. An input terminal of the first inverter is connected to a capacitor. An output terminal of the second inverter is connected to a gate terminal of the PMOS FET. An input terminal of the second inverter is connected to the output terminal of the first inverter. In this example, a second inverter output low may enable the battery-disconnect subcircuit 1107, and a second inverter output high may disable the battery-disconnect subcircuit 1107.

In an example, the battery-disconnect circuit 1100 may include an on-off subcircuit 1112. The on-off subcircuit 1112 may be configured to control signals to the latch 1105. For example, an on signal may be a pulse that sets the latch 1105 and turns on the battery-disconnect subcircuit 1107, and an off signal may be a pulse that clears the latch 1105 and turns off the battery-disconnect subcircuit 1107. The signal level shifting inverter may be configured to set the latch 1105 and switch the battery-disconnect subcircuit 1107 to the power supply state in response to an on signal. The signal level shifting inverter may be configured to clear the latch 1105 and switch the battery-disconnect subcircuit 1107 to the no-power supply state in response to an off signal.

An off terminal of the on-off subcircuit 1112 may be connected to the input terminal of the first inverter and the output terminal of the second inverter. An on terminal of the on-off subcircuit 1112 may be connected to the input terminal of the second inverter and the power-enable subcircuit 1109. The on-off subcircuit may be configured to control current leakage of the battery. For example, an on signal may switch the battery-disconnect subcircuit 1100 to a power supply state, and an off signal may switch the battery-disconnect subcircuit 1100 to a no-power supply state.

A circuit may always be functioning as long as the battery is attached to the device. For example, the battery cutoff voltage may be greater than 2.8V. Upon initial power application, for example attaching the battery to the device, the battery-disconnect circuit may enter a power enable state due to the capacitor on the first inverter U1A input, as shown in FIG. 5. In an example where the battery-disconnect circuit is in a no-power supply state, pressing a power key on the device will cause the battery-disconnect circuit to enter a power enable state.

Power is applied to the device in the power enable state. When the device determines to enter a battery disconnect mode, an on-off subcircuit of the battery-disconnect circuit may pulse an off line. The battery-disconnect circuit may enter a no-power supply state and disable the power-enable subcircuit. Disabling the power-enable subcircuit removes power from the device. The device may be configured to complete all device processing prior to applying the disable signal. If a charger is attached to the device, no further action from the battery-disconnect circuit may be needed since the circuit is in the power enable state.

Power to the device is removed in the no-power supply state. The power button of the device may switch the battery-disconnect circuit to the power enable state and enable the power-enable subcircuit. This action applies power to the device and applies the power button signal to the device to power up the device. Attaching a charger cable to the device will wake up the camera and may be independent of the battery-disconnect circuit and the battery. Once the device has completed its power up processing and before it enables battery charging, the device may pulse the on line to the battery-disconnect circuit. The battery-disconnect circuit may enable the power-enable subcircuit to provide a low impedance charging path between the device and the battery. The battery-disconnect circuit may remain in the power enable state when the charger is removed.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A battery-disconnect circuit comprising:
   a latch;
   a battery-disconnect subcircuit configured to control current leakage and connected to the latch, the latch configured to maintain a power supply state and a no-power supply state of the battery-disconnect subcircuit;
   a power-enable subcircuit connected to the battery-disconnect subcircuit, wherein an enable signal switches the battery-disconnect subcircuit to the power supply state and an off signal switches the battery-disconnect subcircuit to the no-power supply state; and
   a level shifting buffer that comprises a first n-type metal-oxide semiconductor field-effect transistor (NMOS FET) and a second NMOS FET, wherein a first gate terminal of the first NMOS FET is connected to a second gate terminal of the second NMOS FET.

2. The battery-disconnect circuit of claim 1, wherein the battery-disconnect subcircuit comprises a p-type metal-oxide-semiconductor field-effect transistor (PMOS FET).

3. The battery-disconnect circuit of claim 2, wherein the latch is a NOR S/R latch that comprises an input terminal and a Vcc terminal, wherein the input terminal is connected to the gate of the PMOS FET and the Vcc terminal is connected to the source of the PMOS FET.

4. The battery-disconnect circuit of claim 2, wherein the latch is a microcontroller that comprises an IO terminal and a Vcc terminal, wherein the IO terminal is connected to the gate of the PMOS FET and the Vcc terminal is connected to the source of the PMOS FET.

5. The battery-disconnect circuit of claim 1, wherein the level shifting buffer further comprises a p-type metal-oxide semiconductor field-effect transistor (PMOS FET), and wherein a drain terminal of the PMOS FET is connected to the first gate terminal of the first NMOS FET and the second gate terminal of the second NMOS FET.

6. The battery-disconnect circuit of claim 1, wherein the first NMOS FET and the second NMOS FET have a Vdss≥12V and a Vgsth≥1.5V at 1 mA.

7. The battery-disconnect circuit of claim 5, wherein the latch comprises a first inverter and a second inverter, wherein an input terminal of the first inverter is connected to a capacitor and an output terminal of the first inverter is connected to an input terminal of the second inverter, and an output terminal of the second inverter is connected to a gate terminal of the battery-disconnect subcircuit.

8. The battery-disconnect circuit of claim 1 further comprising:
   a signal level shifting inverter configured to control signals to the latch.

9. The battery-disconnect circuit of claim 8, wherein the signal level shifting inverter is configured to set the latch and switch the battery-disconnect subcircuit to the power supply state in response to the on signal.

10. The battery-disconnect circuit of claim 8, wherein the signal level shifting inverter is configured to clear the latch and switch the battery-disconnect subcircuit to the no-power supply state in response to the off signal.

11. An image capture device comprising:
    a battery;
    a processor; and
    a battery-disconnect circuit connected to the battery and the processor, the battery-disconnect circuit comprising:
      a latch;
      a battery-disconnect subcircuit configured to control current leakage and connected to the latch, the latch configured to maintain a power supply state and a no-power supply state of the battery-disconnect subcircuit;
      a power-enable subcircuit connected to the battery-disconnect subcircuit, wherein an enable signal switches the battery-disconnect subcircuit to the power supply state and an off signal switches the battery-disconnect subcircuit to the no-power supply state; and
      a level shifting buffer that comprises a first n-type metal-oxide semiconductor field-effect transistor (NMOS FET), a second NMOS FET, and a p-type metal-oxide semiconductor field-effect transistor (PMOS FET), wherein a drain terminal of the PMOS FET is connected to a first gate terminal of the first NMOS FET and a second gate terminal of the second NMOS FET.

12. The image capture device of claim 11, wherein the battery-disconnect subcircuit comprises a p-type metal-oxide-semiconductor field-effect transistor (PMOS FET).

13. The image capture device of claim 12, wherein the latch is a NOR SIR latch that comprises an input terminal and a Vcc terminal, wherein the input terminal is connected to the gate of the PMOS FET and the Vcc terminal is connected to the source of the PMOS FET.

14. The image capture device of claim 12, wherein the latch is a microcontroller that comprises an IO terminal and a Vcc terminal, wherein the IO terminal is connected to the gate of the PMOS FET and the Vcc terminal is connected to the source of the PMOS FET.

15. The image capture device of claim 11, wherein the level shifting buffer further comprises a p-type metal-oxide semiconductor field-effect transistor (PMOS FET), and wherein a drain terminal of the PMOS FET is connected to the first gate terminal of the first NMOS FET and the second gate terminal of the second NMOS FET.

16. The image capture device of claim 11, wherein the first NMOS FET and the second NMOS FET have a Vdss≥12V and a Vgsth≥1.5V at 1 mA.

17. The image capture device of claim 15, wherein the latch comprises a first inverter and a second inverter, wherein an input terminal of the first inverter is connected to a capacitor and an output terminal of the first inverter is connected to an input terminal of the second inverter, wherein an output terminal of the second inverter is connected to a gate terminal of the battery-disconnect subcircuit.

18. The image capture device of claim 11, wherein the battery-disconnect circuit further comprises:
a signal level shifting inverter configured to control signals to the latch, wherein the signal level shifting inverter is configured to set the latch and switch the battery-disconnect subcircuit to the power supply state in response to the on signal.

19. The image capture device of claim 11, wherein the battery-disconnect circuit further comprises:
a signal level shifting inverter configured to control signals to the latch, wherein the signal level shifting inverter is configured to clear the latch and switch the battery-disconnect subcircuit to the no-power supply state in response to the off signal.

20. An image capture device comprising:
a battery;
a processor; and
a battery-disconnect circuit connected to the battery and the processor, the battery-disconnect circuit comprising:
a battery-disconnect subcircuit configured to control current leakage;
a latch configured to maintain a power supply state and a no-power supply state of the battery-disconnect subcircuit, wherein the latch comprises a first inverter and a second inverter, wherein an input terminal of the first inverter is connected to a capacitor and an output terminal of the first inverter is connected to an input terminal of the second inverter, and an output terminal of the second inverter is connected to a gate terminal of the battery-disconnect subcircuit;
a power-enable subcircuit connected to the battery-disconnect subcircuit; and
a level shifting buffer that comprises a first n-type metal-oxide semiconductor field-effect transistor (NMOS FET) and a second NMOS FET, wherein the output terminal of the second inverter is connected to a drain terminal of the first NMOS FET, and a first gate terminal of the first NMOS FET is connected to a second gate terminal of the second NMOS FET.

* * * * *